United States Patent
Chu et al.

(10) Patent No.: US 9,236,477 B2
(45) Date of Patent: Jan. 12, 2016

(54) GRAPHENE TRANSISTOR WITH A SUBLITHOGRAPHIC CHANNEL WIDTH

(71) Applicant: GLOBALFOUNDRIES INC., Grand Cayman (KY)

(72) Inventors: Jack O. Chu, Manhasset Hills, NY (US); Christos Dimitrakopoulos, Baldwin Place, NY (US); Eric C. Harley, Lagrangeville, NY (US); Judson R. Holt, Wappingers Falls, NY (US); Timothy J. McArdle, Hopewell Junction, NY (US); Matthew W. Stoker, Poughkeepsie, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/181,832

(22) Filed: Feb. 17, 2014

(65) Prior Publication Data

US 2015/0236147 A1    Aug. 20, 2015

(51) Int. Cl.
*H01L 29/78* (2006.01)
*H01L 29/16* (2006.01)
*H01L 21/02* (2006.01)
*H01L 21/324* (2006.01)
*H01L 29/66* (2006.01)
*H01L 29/06* (2006.01)

(52) U.S. Cl.
CPC ........ *H01L 29/785* (2013.01); *H01L 21/02527* (2013.01); *H01L 21/02612* (2013.01); *H01L 21/324* (2013.01); *H01L 29/0649* (2013.01); *H01L 29/1606* (2013.01); *H01L 29/1608* (2013.01); *H01L 29/66795* (2013.01)

(58) Field of Classification Search
USPC .......................................... 257/29
See application file for complete search history.

(56) References Cited

U.S. PATENT DOCUMENTS

| 7,772,059 B2 | 8/2010 | Parikh et al. |
| 8,211,759 B2 | 7/2012 | Anderson et al. |

(Continued)

FOREIGN PATENT DOCUMENTS

| JP | 2013-129548 A | 7/2013 |
| WO | 2012/145079 A1 | 10/2012 |

OTHER PUBLICATIONS

McArdle, T.J. et al., "Multilayer Epitaxial Graphene Formed by Pyrolysis of Polycrystalline Silicon-Carbide Grown on C-Plane Sapphire Substrates" Applied Physics Letters (Mar. 2011) pp. 132108-1-132108-3, vol. 98, Issue 13.

*Primary Examiner* — Michael Jung
*Assistant Examiner* — Charles R Peters
(74) *Attorney, Agent, or Firm* — Scully, Scott, Murphy & Presser, P.C.

(57) ABSTRACT

Silicon-carbon alloy structures can be formed as inverted U-shaped structures around semiconductor fins by a selective epitaxy process. A planarization dielectric layer is formed to fill gaps among the silicon-carbon alloy structures. After planarization, remaining vertical portions of the silicon-carbon alloy structures constitute silicon-carbon alloy fins, which can have sublithographic widths. The semiconductor fins may be replaced with replacement dielectric material fins. In one embodiment, employing a patterned mask layer, sidewalls of the silicon-carbon alloy fins can be removed around end portions of each silicon-carbon alloy fin. An anneal is performed to covert surface portions of the silicon-carbon alloy fins into graphene layers. In one embodiment, each graphene layer can include only a horizontal portion in a channel region, and include a horizontal portion and sidewall portions in source and drain regions. If a patterned mask layer is not employed, each graphene layer can include only a horizontal portion.

20 Claims, 16 Drawing Sheets

(56) References Cited

U.S. PATENT DOCUMENTS 8,354,296 B2  1/2013  Dimitrakopoulos et al.
8,476,617 B2  7/2013  Dimitrakopoulos et al.
2012/0261643 A1  10/2012  Cohen et al.
2012/0326128 A1  12/2012  Shin et al.
2015/0108499 A1*  4/2015  Alptekin et al. ............... 257/77

* cited by examiner

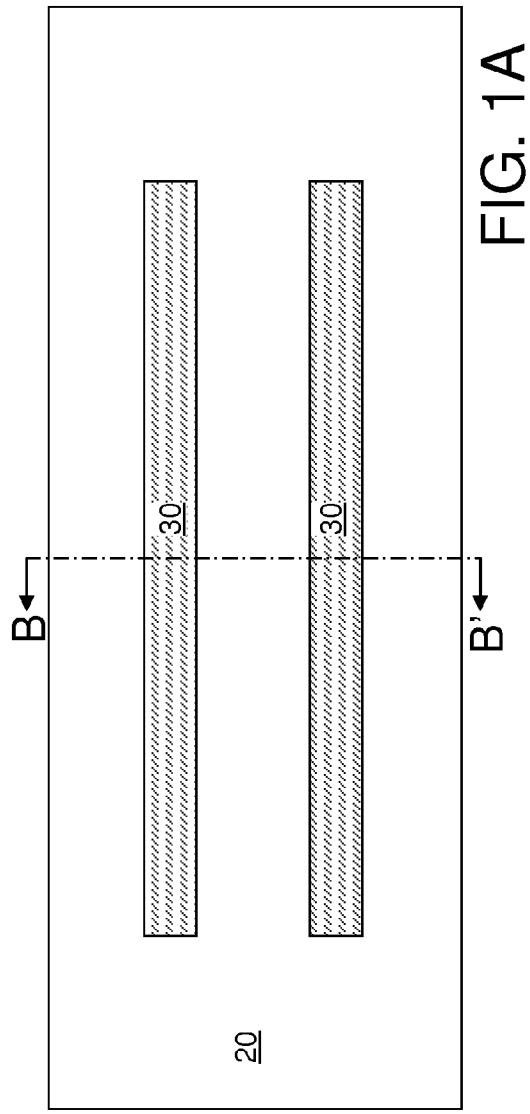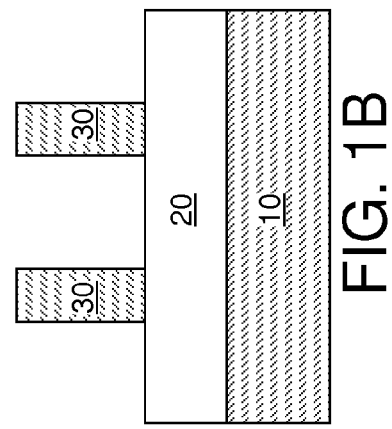

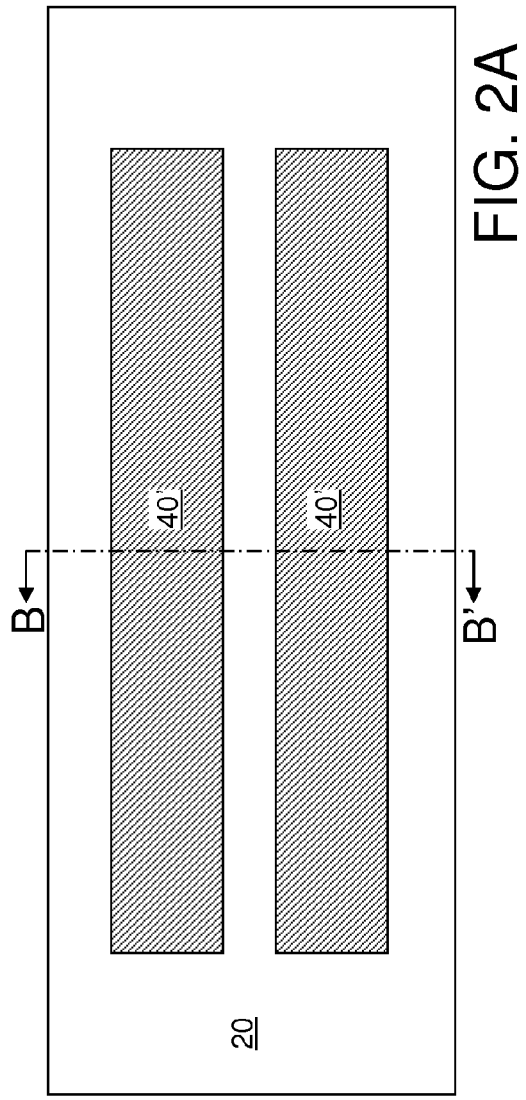
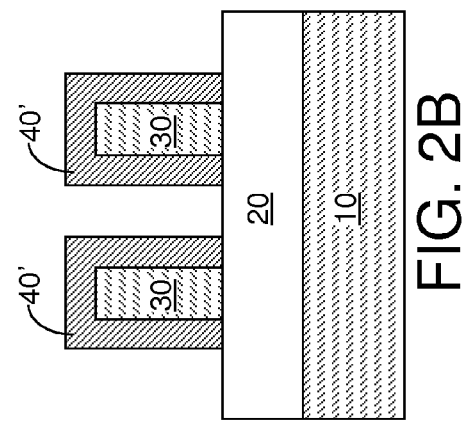
FIG. 2A
FIG. 2B

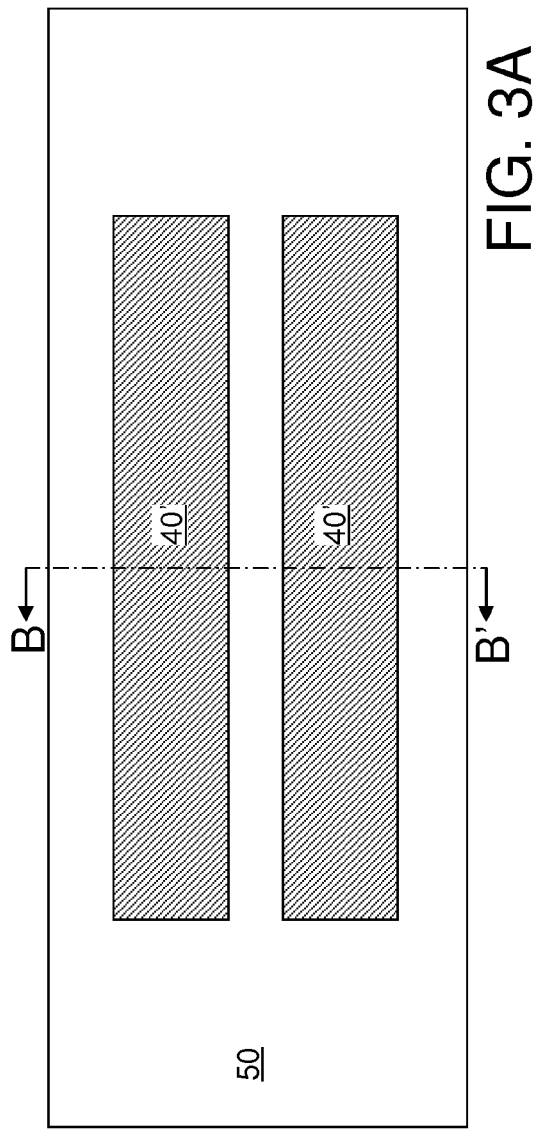
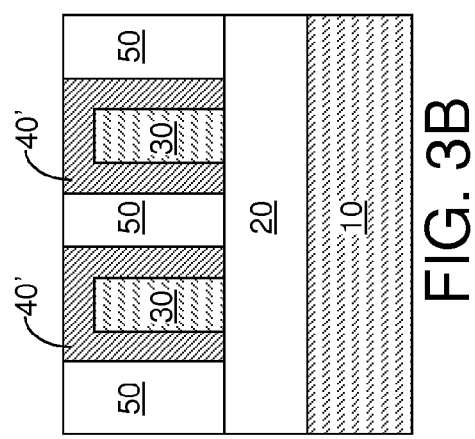
FIG. 3A
FIG. 3B

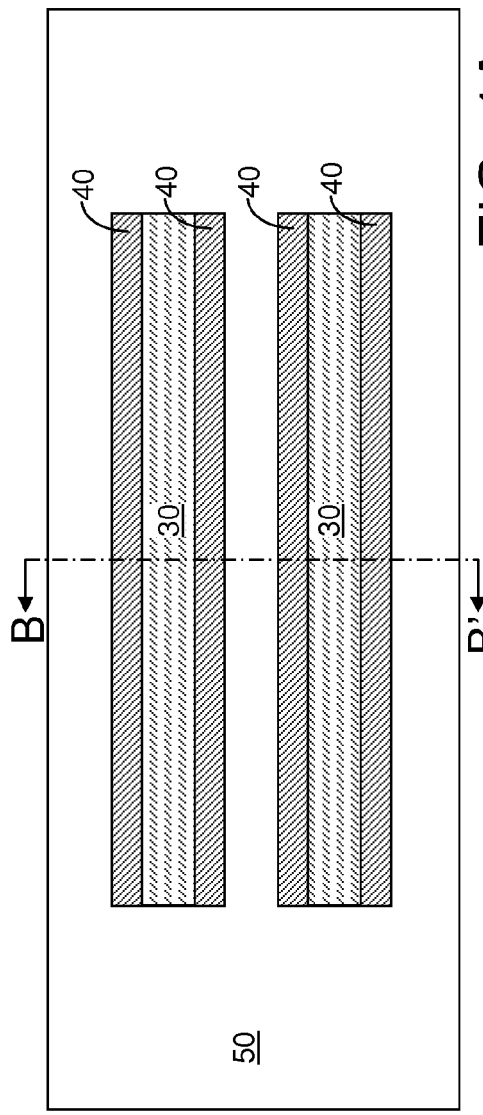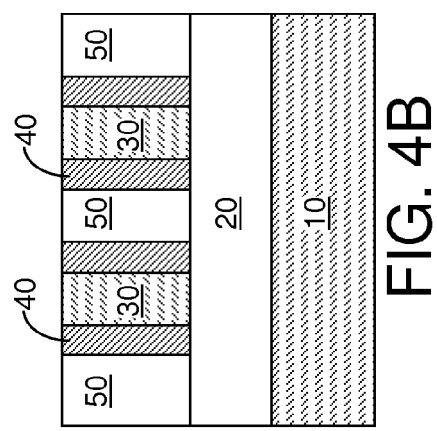

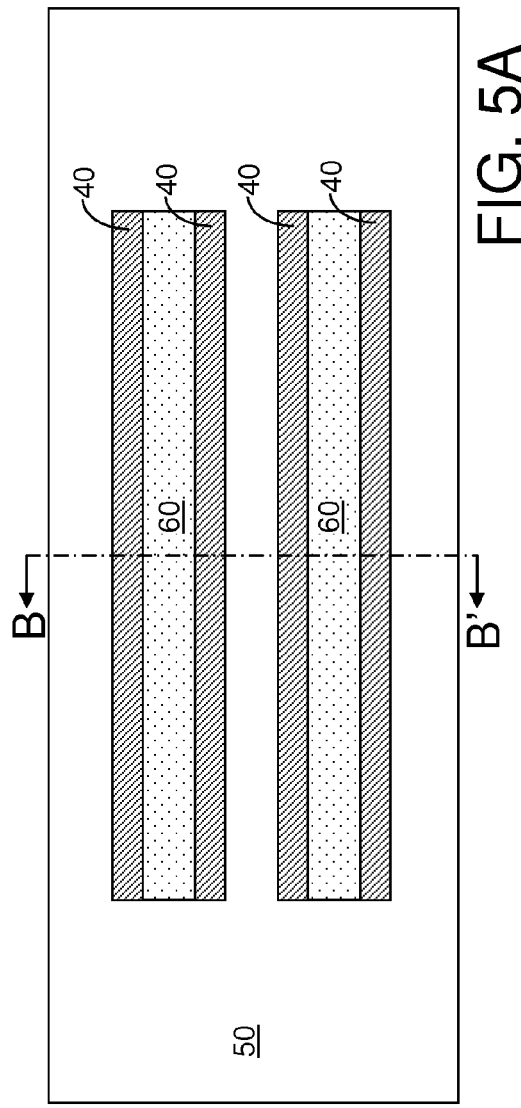
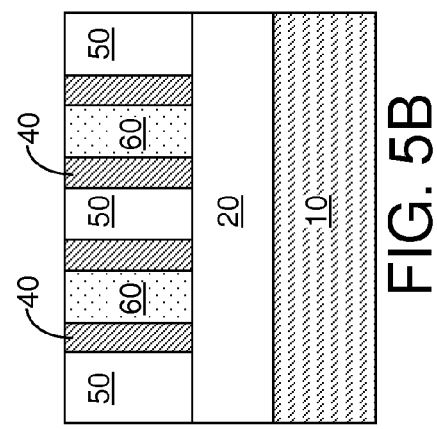

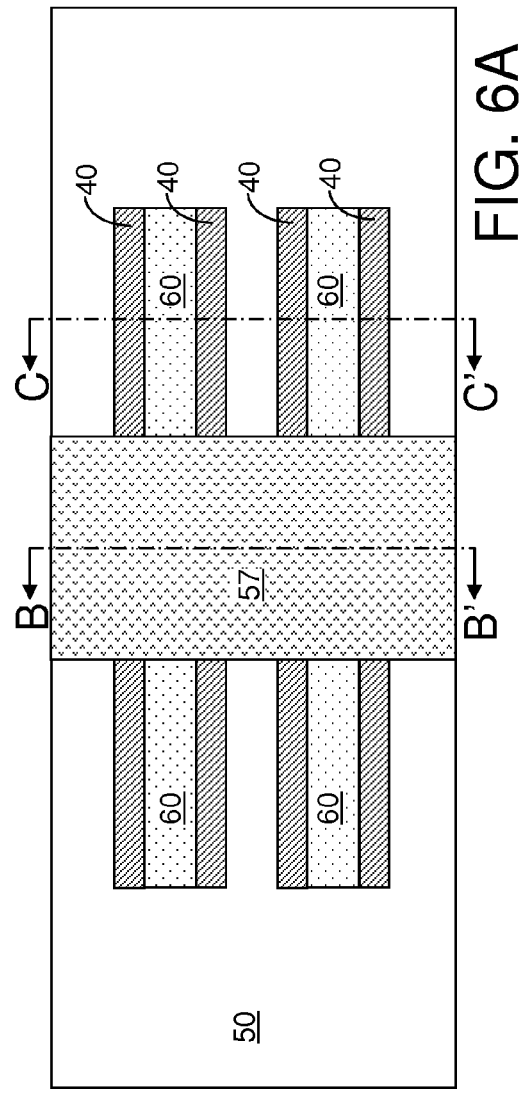
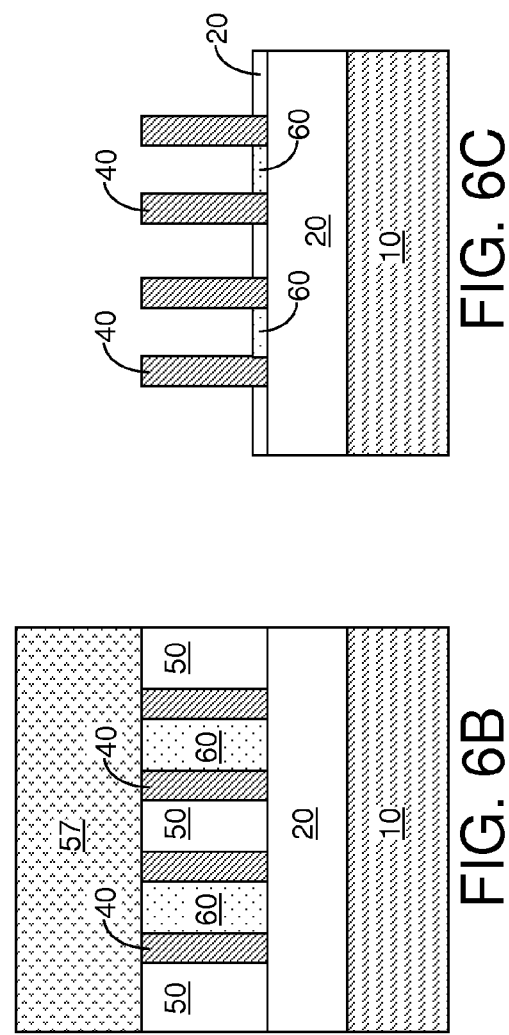

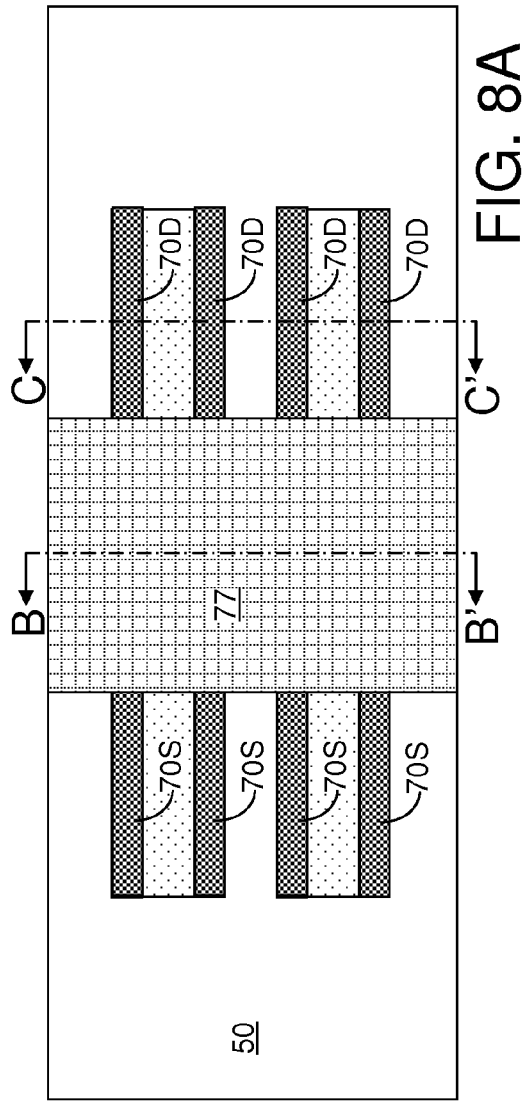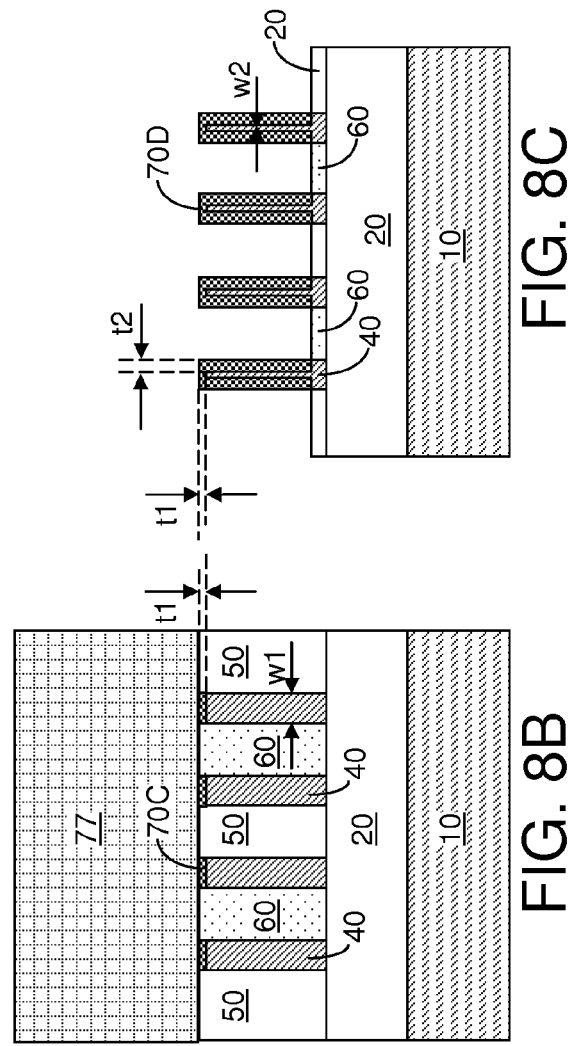

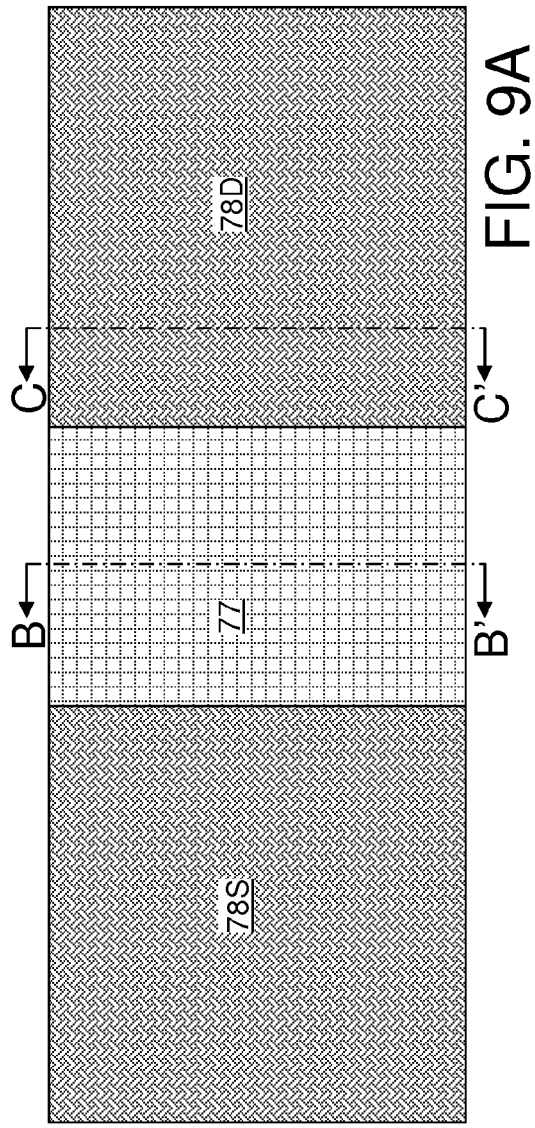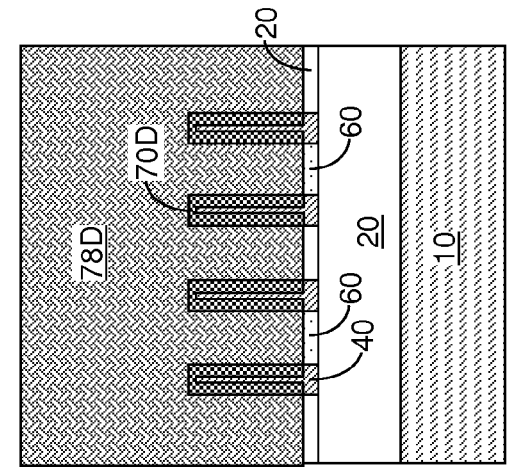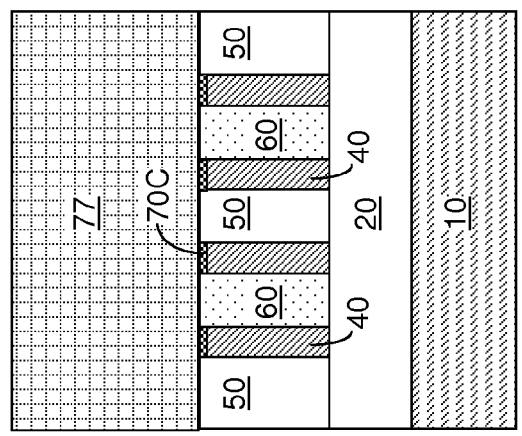

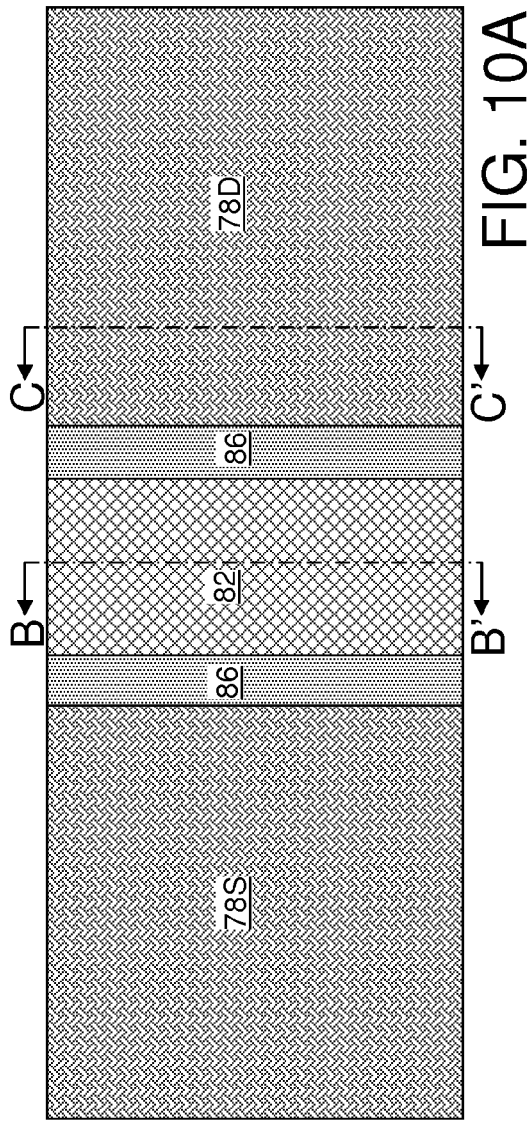
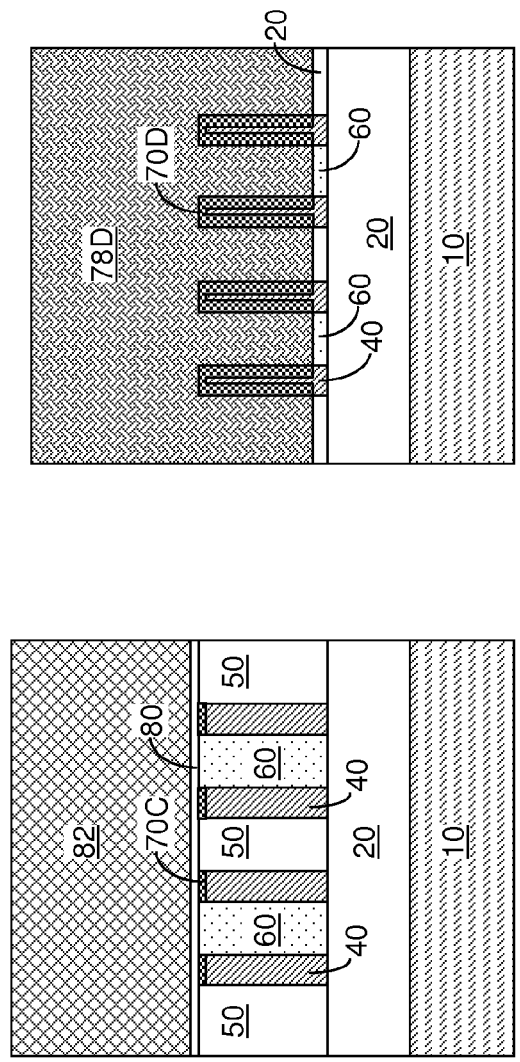

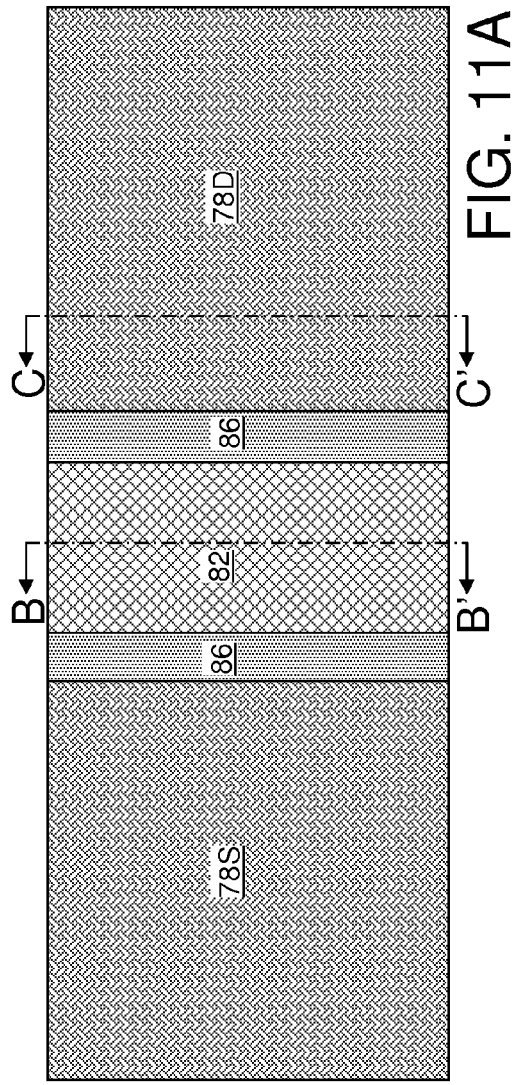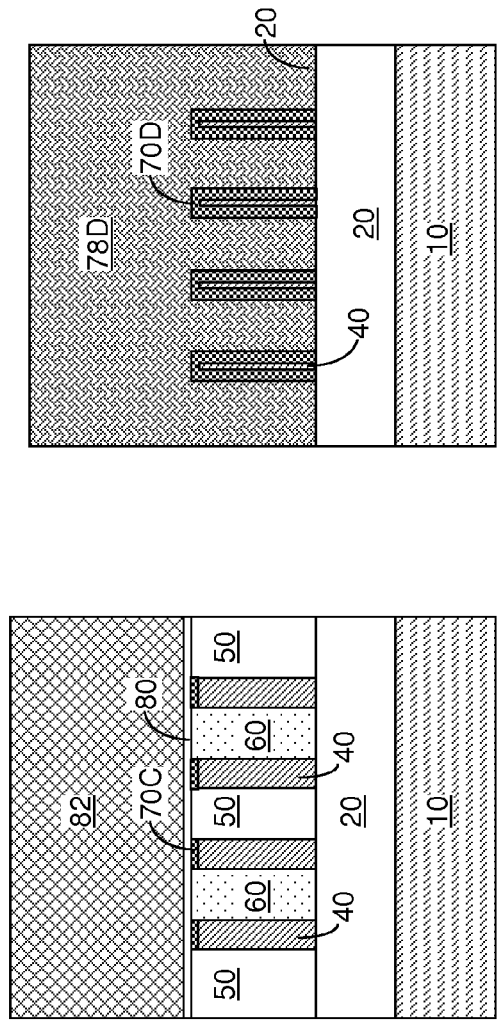

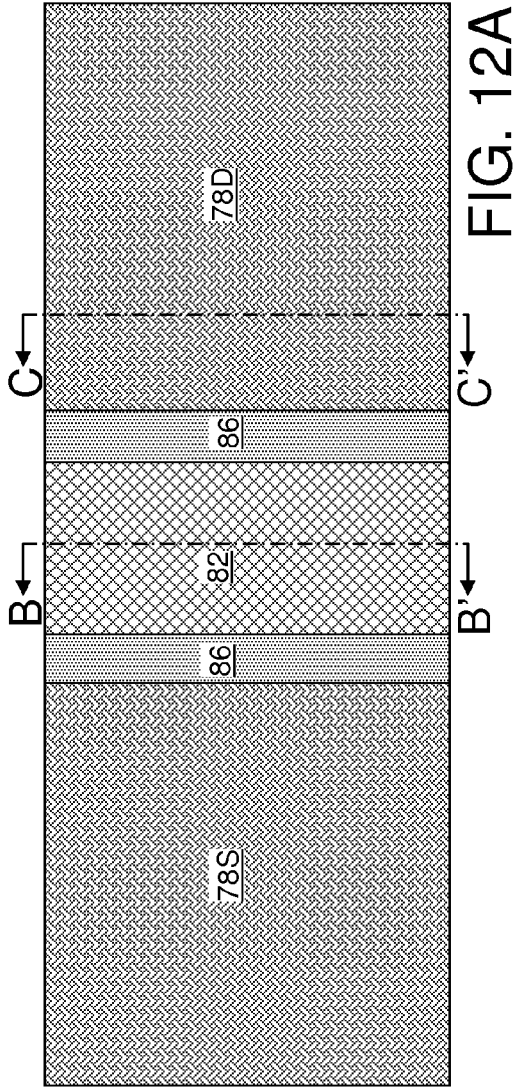

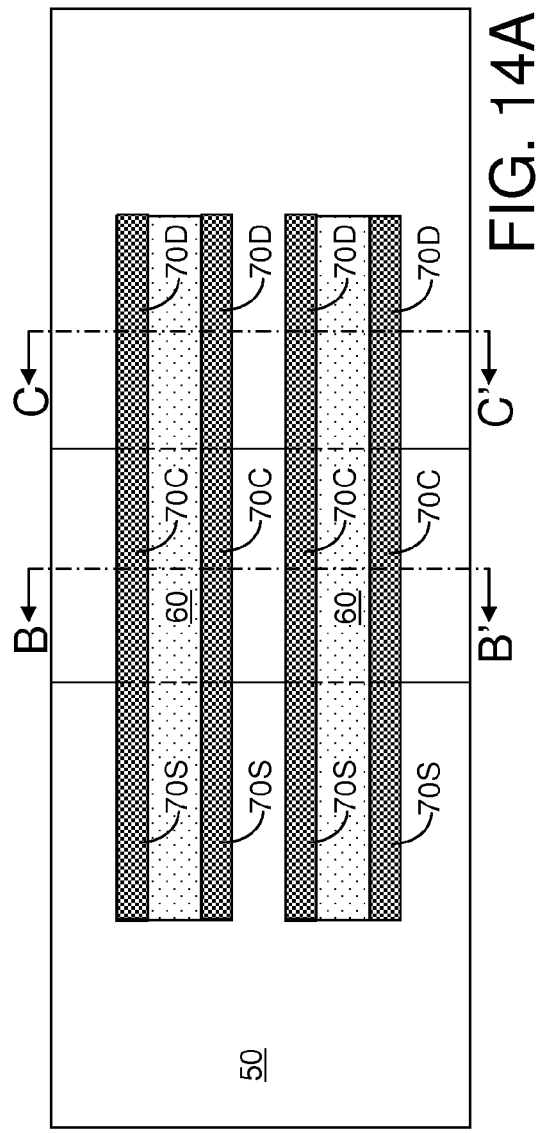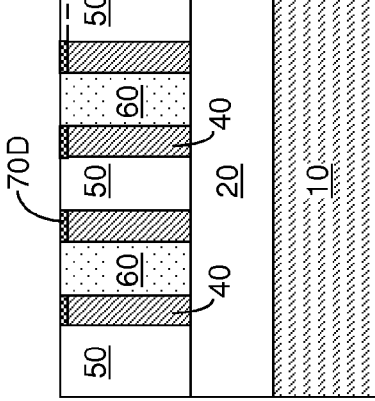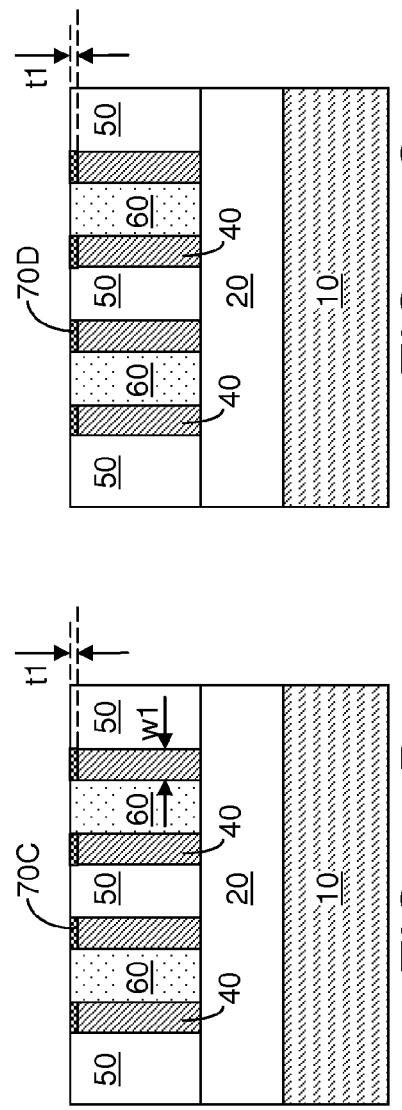

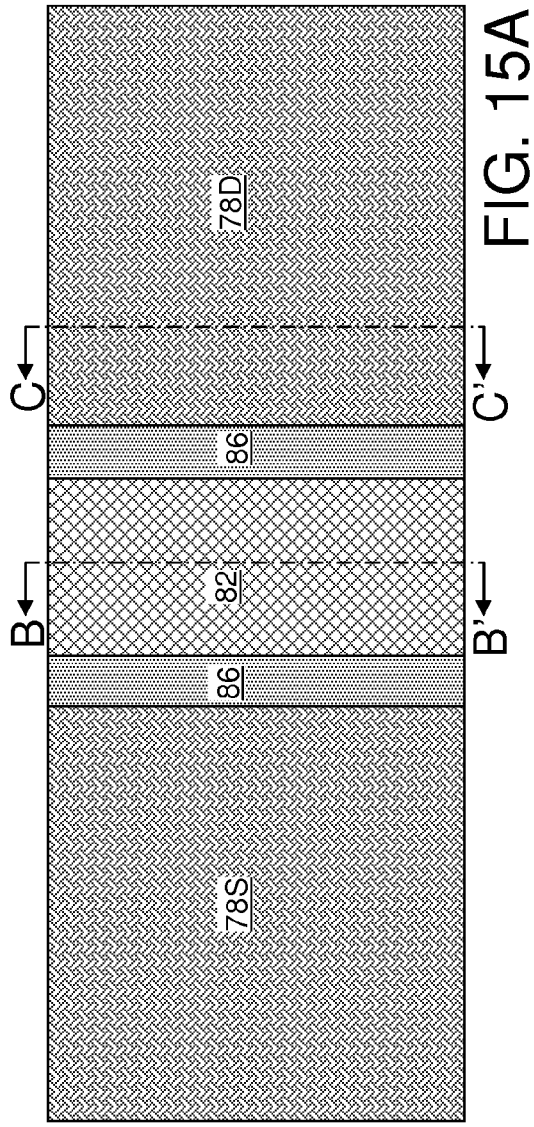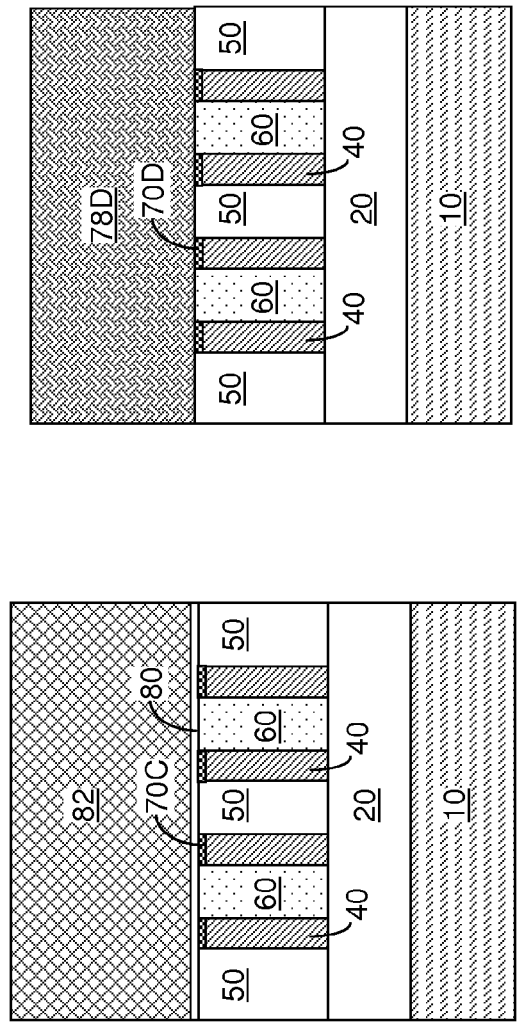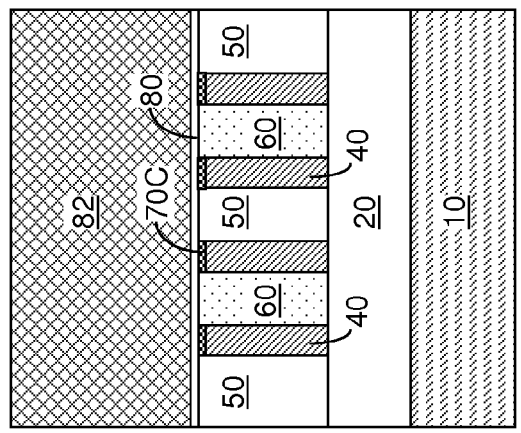

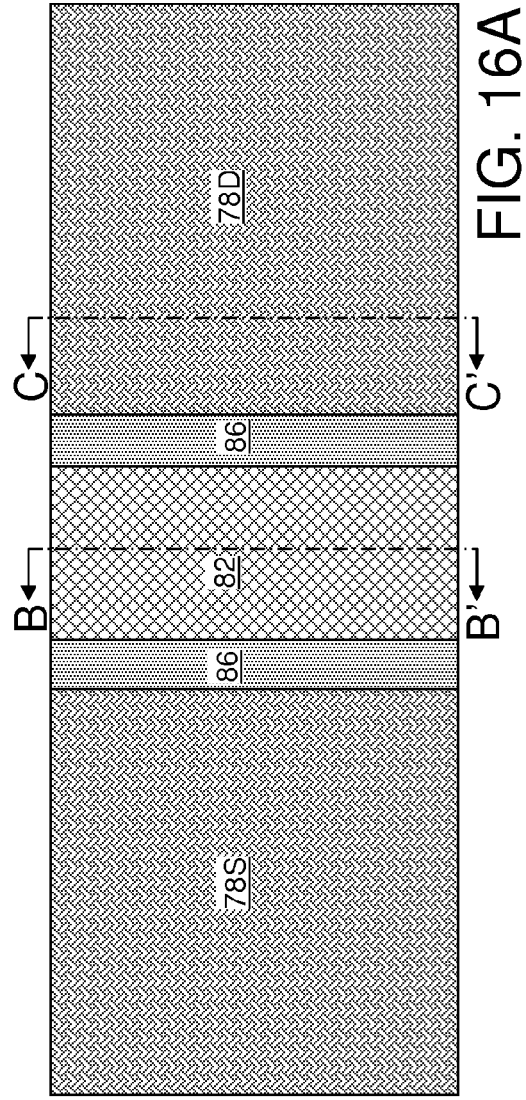
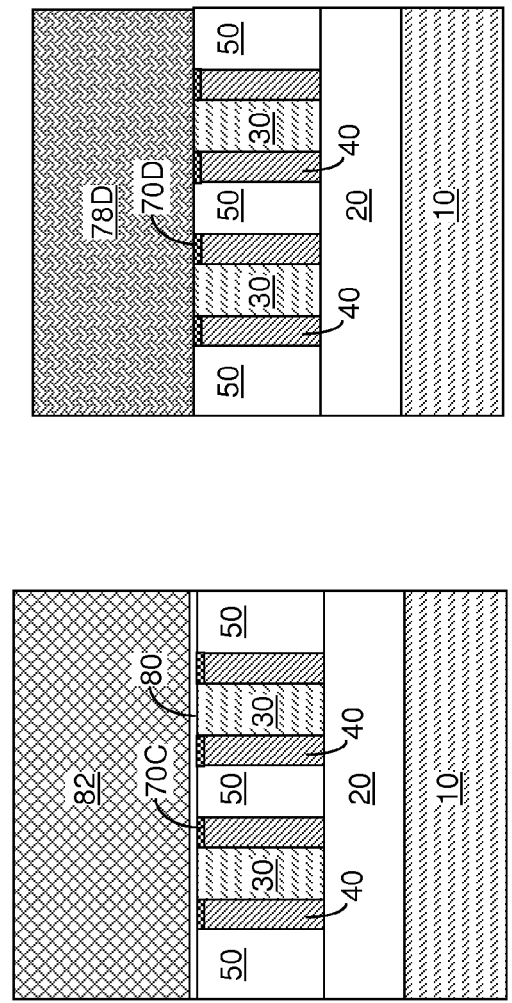
FIG. 16A
FIG. 16B
FIG. 16C

GRAPHENE TRANSISTOR WITH A SUBLITHOGRAPHIC CHANNEL WIDTH

BACKGROUND

The present disclosure relates to a graphene device, and particularly to a graphene transistor having a sublithographic channel width and methods of manufacturing the same.

Graphene provides high mobility of charge carriers that may be suitable for future electronic devices. However, a graphene sheet for high performance field effect transistor applications must be limited to one or two graphene monolayers, and have a gate length and a gate width that are limited to nanoscale to form a band gap. For example, the lateral dimensions of a graphene sheet must be limited to dimensions less than 20 nm to generate a usable band gap compatible with current field effect transistor technology.

The minimum lithographic dimension that can be printed directly on a photoresist layer employing a single lithographic exposure is referred to as a critical dimension. As of 2013, the critical dimension is about 32 nm. Thus, patterning a graphene sheet employing lithographic techniques to generate a usable band gap is difficult.

SUMMARY

Semiconductor fins are provided on a substrate including an insulator top surface. Silicon-carbon alloy structures can be formed as inverted U-shaped structures around the semiconductor fins by a selective epitaxy process. After optional truncation of the end portions of the silicon-carbon alloy structures, a planarization dielectric layer is formed to fill gaps among the silicon-carbon alloy structures. Top portions of each silicon-carbon alloy structure are removed in a planarization process to expose top surfaces of the semiconductor fins. Remaining portions of the silicon-carbon alloy structures constitute silicon-carbon alloy fins.

The silicon-carbon alloy fins can have sublithographic widths. The semiconductor fins may be replaced with replacement dielectric material fins. In one embodiment, employing a patterned mask layer, sidewalls of the silicon-carbon alloy fins can be removed around end portions of each silicon-carbon alloy fin. An anneal is performed to covert surface portions of the silicon-carbon alloy fins into graphene layers. In one embodiment, each graphene layer can include only a horizontal portion in a channel region, and include a horizontal portion and sidewall portions in source and drain regions. Suitable selection of surface orientations of the silicon-carbon alloy fins can induce formation of thicker sidewall portions of the graphene layers with respect to horizontal portions of the graphene layers so as to reduce electrical contacts to source and drain regions. If a patterned mask layer is not employed, each graphene layer can include only a horizontal portion.

According to an aspect of the present disclosure, a method of forming a structure is provided. A semiconductor fin is formed on an insulator layer. A silicon-carbon alloy structure is formed by selective epitaxy of a silicon-carbon alloy on surfaces of the semiconductor fin. A planarization dielectric layer is formed around the silicon-carbon alloy structure and above the insulator layer. A horizontal portion of the silicon-carbon alloy structure is removed. A remaining vertical portion of the silicon-carbon alloy structure constitutes a silicon-carbon alloy fin. A set of at least one contiguous physically exposed surface portion of the silicon-carbon alloy fin is converted into a graphene layer by an anneal process.

According to another aspect of the present disclosure, a semiconductor structure includes a silicon-carbon alloy fin located on an insulator layer, a graphene layer located on a top surface of the silicon-carbon alloy fin, and a dielectric material layer embedding the silicon-carbon alloy fin. An interface between the graphene layer and the silicon-carbon alloy fin is recessed relative to a top surface of the dielectric material layer. The semiconductor structure further includes a gate structure including a stack of a gate dielectric and a gate electrode and straddling the silicon-carbon alloy fin and contacting the top surface of the dielectric material layer.

BRIEF DESCRIPTION OF THE SEVERAL VIEWS OF THE DRAWINGS

FIG. 1A is a top-down view of a first exemplary structure after formation of semiconductor fins according to an embodiment of the present disclosure.

FIG. 1B is a vertical cross-sectional view of the first exemplary structure along the vertical plane B-B' of FIG. 1A.

FIG. 2A is a top-down view of the first exemplary structure after formation of inverted U-shaped silicon-carbon alloy structures by selective epitaxy according to an embodiment of the present disclosure.

FIG. 2B is a vertical cross-sectional view of the first exemplary structure along the vertical plane B-B' of FIG. 2A.

FIG. 3A is a top-down view of the first exemplary structure after truncation of end portions of the inverted U-shaped silicon-carbon alloy structures and formation of a planarization dielectric layer according to an embodiment of the present disclosure.

FIG. 3B is a vertical cross-sectional view of the first exemplary structure along the vertical plane B-B' of FIG. 3A.

FIG. 4A is a top-down view of the first exemplary structure after formation of silicon-carbon alloy fins by removal of top portions of the inverted U-shaped silicon-carbon alloy structures by planarization according to an embodiment of the present disclosure.

FIG. 4B is a vertical cross-sectional view of the first exemplary structure along the vertical plane B-B' of FIG. 4A.

FIG. 5A is a top-down view of the first exemplary structure after replacement of semiconductor fins with dielectric material fins according to an embodiment of the present disclosure.

FIG. 5B is a vertical cross-sectional view of the first exemplary structure along the vertical plane B-B' of FIG. 5A.

FIG. 6A is a top-down view of the first exemplary structure after formation of a patterned mask layer and recessing of the planarization dielectric layer and the dielectric material fins according to an embodiment of the present disclosure.

FIG. 6B is a vertical cross-sectional view of the first exemplary structure along the vertical plane B-B' of FIG. 6A.

FIG. 6C is a vertical cross-sectional view of the first exemplary structure along the vertical plane C-C' of FIG. 6A.

FIG. 8A is a top-down view of the first exemplary structure after masking portions of the graphene layers to be employed as channel portions with a masking layer according to an embodiment of the present disclosure.

FIG. 8B is a vertical cross-sectional view of the first exemplary structure along the vertical plane B-B' of FIG. 8A.

FIG. 8C is a vertical cross-sectional view of the first exemplary structure along the vertical plane C-C' of FIG. 8A.

FIG. 9A is a top-down view of the first exemplary structure after depositing a conductive material to form a source contact structure and a drain contact structure according to an embodiment of the present disclosure.

FIG. 9B is a vertical cross-sectional view of the first exemplary structure along the vertical plane B-B' of FIG. 9A.

FIG. 9C is a vertical cross-sectional view of the first exemplary structure along the vertical plane C-C' of FIG. 9A.

FIG. 10A is a top-down view of the first exemplary structure after formation of a dielectric spacer and a gate structure including a gate dielectric and a gate electrode according to an embodiment of the present disclosure.

FIG. 10B is a vertical cross-sectional view of the first exemplary structure along the vertical plane B-B' of FIG. 10A.

FIG. 10C is a vertical cross-sectional view of the first exemplary structure along the vertical plane C-C' of FIG. 10A.

FIG. 11A is a top-down view of a first variation of the first exemplary structure according to an embodiment of the present disclosure.

FIG. 11B is a vertical cross-sectional view of the first variation of the first exemplary structure along the vertical plane B-B' of FIG. 11A.

FIG. 11C is a vertical cross-sectional view of the first variation of the first exemplary structure along the vertical plane C-C' of FIG. 11A.

FIG. 12A is a top-down view of a second variation of the first exemplary structure according to an embodiment of the present disclosure.

FIG. 12B is a vertical cross-sectional view of the second variation of the first exemplary structure along the vertical plane B-B' of FIG. 12A.

FIG. 12C is a vertical cross-sectional view of the second variation of the first exemplary structure along the vertical plane C-C' of FIG. 12A.

FIG. 14A is a top-down view of a second exemplary structure after formation of graphene layers according to an embodiment of the present disclosure.

FIG. 14B is a vertical cross-sectional view of the second exemplary structure along the vertical plane B-B' of FIG. 14A.

FIG. 14C is a vertical cross-sectional view of the second exemplary structure along the vertical plane C-C' of FIG. 14A.

FIG. 15A is a top-down view of the second exemplary structure after formation of a source contact structure, a drain contact structure, a dielectric spacer, and a gate structure according to an embodiment of the present disclosure.

FIG. 15B is a vertical cross-sectional view of the second exemplary structure along the vertical plane B-B' of FIG. 15A.

FIG. 15C is a vertical cross-sectional view of the second exemplary structure along the vertical plane C-C' of FIG. 15A.

FIG. 16A is a top-down view of a variation of the second exemplary structure according to an embodiment of the present disclosure.

FIG. 16B is a vertical cross-sectional view of the variation of the second exemplary structure along the vertical plane B-B' of FIG. 16A.

FIG. 16C is a vertical cross-sectional view of the variation of the second exemplary structure along the vertical plane C-C' of FIG. 16A.

DETAILED DESCRIPTION

Figure 7A:
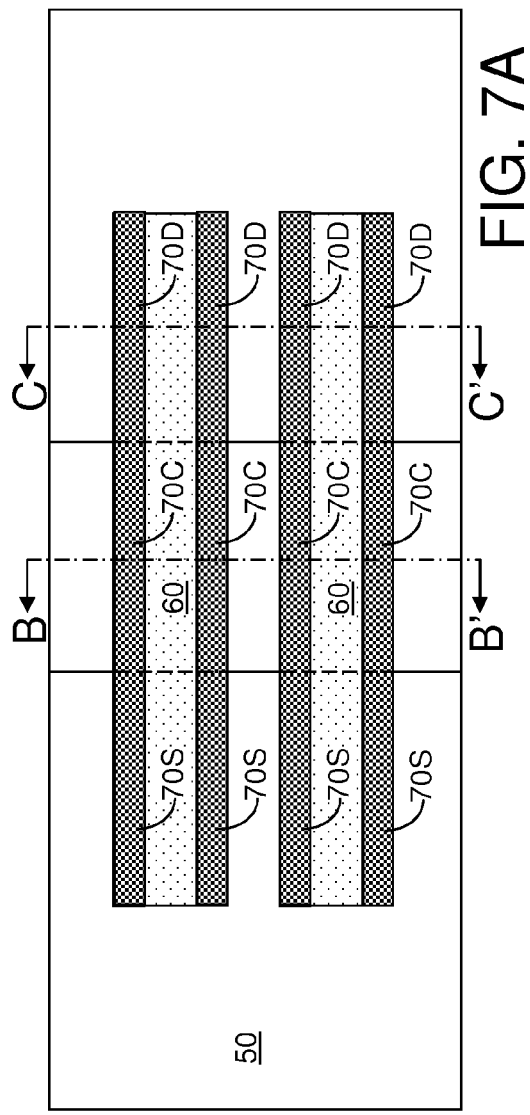
FIG. 7A is a top-down view of the first exemplary structure after formation of graphene layers from physically exposed surface portions of the silicon-carbon alloy fins according to an embodiment of the present disclosure.

As stated above, the present disclosure relates to a graphene transistor having a sublithographic channel width and methods of manufacturing the same, which are now described in detail with accompanying figures. It is noted that like reference numerals refer to like elements across different embodiments. As used herein, ordinals such as "first" and "second" are employed merely to distinguish similar elements, and different ordinals may be employed to designate a same element in the specification and/or claims.

Referring to FIGS. 1A and 1B, a first exemplary structure according to an embodiment of the present disclosure includes semiconductor fins 30 formed on a substrate (10, 20). The semiconductor fins 30 includes a single crystalline semiconductor material such as single crystalline silicon, a single crystalline silicon-germanium alloy, or any other single crystalline semiconductor material on which silicon carbide or a single crystalline silicon carbon alloy having a crystal structure of silicon carbide can be epitaxially deposited. In one embodiment, the semiconductor fins 30 can include single crystalline silicon. As used herein, a "fin" refers to a structure having a pair of sidewalls that are parallel to each other and a combination of a horizontal top surface and a horizontal bottom surface. As used herein, a "semiconductor fin" refers to a fin consisting of at least one semiconductor material.

In one embodiment, the substrate (10, 20) can include a vertical stack of a handle substrate 10 and an insulator layer 20. In one embodiment, the first exemplary structure can be formed by providing a semiconductor-on-insulator (SOI) substrate and patterning a top semiconductor layer therein to form a plurality of semiconductor fins 30. In one embodiment, the plurality of semiconductor fins 30 can extend along a lengthwise direction and can be parallel to each other. As used herein, a lengthwise direction of an element is a direction that is parallel to an axis of rotation passing through the center of mass of the element and providing the least moment of inertia. As used herein, a widthwise direction of an element is a direction that is horizontal and perpendicular to the lengthwise direction of the element. In case a semiconductor fin is a rectangular parallelepiped, the lengthwise direction of the semiconductor fin is parallel to the direction of the longest edge of the semiconductor fin.

In another embodiment, the semiconductor fins 30 can be formed by providing a bulk semiconductor substrate such as a single crystalline silicon substrate, and by patterning the top portion of the bulk semiconductor substrate. In this case, the semiconductor fins 30 are adjoined to a remaining bottom portion of the bulk semiconductor substrate. A shallow trench isolation layer including a dielectric material can be formed around lower portions of the semiconductor fins 30. As such, the shallow trench isolation layer is an insulator layer. In one embodiment, the shallow trench isolation layer can be formed by depositing a dielectric material over the semiconductor fins 30, planarizing the deposited dielectric material, and recessing the dielectric material below the top surface of the semiconductor fins 30. In another embodiment, the shallow trench isolation layer can be formed by spin coating such that the top surface of the shallow trench isolation layer is formed below the top surfaces of the semiconductor fins 30.

In one embodiment, lengthwise sidewalls of the semiconductor fins 30 can have a surface orientation having a three-fold symmetry. For example, the lengthwise sidewalls of the semiconductor fins 30 can have a (111) surface orientation of a diamond cubic crystal structure. In one embodiment, the top surfaces of the semiconductor fins can have a surface orientation that does not have a three-fold symmetry. For example, the top surfaces of the semiconductor fins 30 can have a (110) surface orientation of a diamond cubic crystal structure.

The height of the portion of each semiconductor fin 30 located above the top surface of a dielectric material layer (such as the insulator layer 20 or the shallow trench isolation layer in the case of semiconductor fins formed on a bulk semiconductor substrate) can be in a range from 30 nm to 300 nm, although lesser and greater heights can also be employed. In one embodiment, the width of each semiconductor fin 30 can be a lithographic dimension, i.e., a dimension that can be printed employing a single lithographic exposure and a pattern transfer. In another embodiment, the semiconductor fins 30 can be formed by a sidewall image transfer (SIT) process as known in the art, in which case the width of each semiconductor fin 30 can be a sublithographic dimension, i.e., a dimension less than a critical dimension (which is the minimum lithographic dimension that can be printed by a single lithographic exposure and development).

Referring to FIGS. 2A and 2B, inverted U-shaped silicon-carbon alloy structures 40' are formed directly on the physically exposed surfaces of the semiconductor fins 30 by selective epitaxy. As used herein, an element is an "inverted U-shaped" structure if the element includes a parallel pair of vertical portions adjoined to each other through a horizontal portion that is adjoined to a topmost portion of each of the parallel pair of vertical portions. The bottom surface of the horizontal portion is raised above a horizontal plane including bottommost surfaces of the parallel pair of vertical portions of the inverted U-shaped structure.

Each inverted U-shaped silicon-carbon alloy structure 40' includes a silicon-carbon alloy. As used herein, a silicon-carbon alloy refers to a compound consisting essentially of silicon and carbon. In one embodiment, the inverted U-shaped silicon-carbon alloy structure 40' can include carbon at an atomic concentration in a range from 10% to 90%. In another embodiment, the inverted U-shaped silicon-carbon alloy structure 40' can include carbon at an atomic concentration in a range from 30% to 70%. In yet another embodiment, the inverted U-shaped silicon-carbon alloy structure 40' can include carbon at an atomic concentration in a range from 45% to 55%. In still another embodiment, the inverted U-shaped silicon-carbon alloy structure 40' can include carbon at an atomic concentration in a range from 49% to 51%. In one embodiment, the inverted U-shaped silicon-carbon alloy structure 40' can include silicon carbide.

The inverted U-shaped silicon-carbon alloy structures 40' can be formed by a selective epitaxy process. During the selective epitaxy process, the first exemplary structure is placed in a process chamber, which is pumped to a based pressure. A combination of a precursor gas for silicon and a precursor gas for carbon is flowed into the process chamber with, or without, a carrier gas. An etchant gas is flowed into the process chamber concurrently with, or alternately with, the combination of the precursor gas for silicon and the precursor gas for carbon. Exemplary gases that can be employed as a precursor gas for silicon include $SiH_4$, $Si_2H_6$, $SiH_2Cl_2$, $SiHCl_3$, $SiCl_4$, and organic silicon-containing precursor gases. Exemplary gases that can be employed as a precursor gas for carbon include $CH_4$, $C_2H_2$, $C_2H_4$, $C_2H_6$, $C_3H_6$, $C_3H_8$, and other saturated or unsaturated hydrocarbon gases. An exemplary gas that can be employed as an etchant gas is hydrogen chloride. The ratio of the flow rate of the precursor gas for silicon and the flow rate of the precursor gas for carbon can be determined based on the target atomic concentration of carbon in the deposited silicon-carbon alloy material, which can be, for example, 50%. The flow rate of the etchant gas can be selected such that deposition of the silicon-carbon alloy does not proceed on insulator surfaces (such as the top surface of the insulator layer 20), and proceeds on the surfaces of the semiconductor fins 30.

In one embodiment, each of the inverted U-shaped silicon-carbon alloy structures 40' can be deposited as a single crystalline structure. In one embodiment, the inverted U-shaped silicon-carbon alloy structures 40' can have a zinc blende structure, which is a crystalline structure of silicon carbide. In one embodiment, the interfaces between the inverted U-shaped silicon-carbon alloy structures 40' and the semiconductor fins 30 can have atomic registry, i.e., alignment of atoms across the interfaces with a two-dimensional periodicity.

The thickness of the vertical portions of each inverted U-shaped silicon-carbon alloy structure 40' can be in a range from 2 nm to 40 nm, although lesser and greater thicknesses can also be employed. In one embodiment, the thickness of the vertical portions of the inverted U-shaped silicon-carbon can be a sublithographic dimension, i.e., a dimension less than the critical dimension. The thickness of the horizontal portion of each inverted U-shaped silicon-carbon alloy structure 40' can be the same as, or can be different from, the thickness of the vertical portions of the inverted U-shaped silicon-carbon alloy structures 40' depending on the growth rate of the silicon-carbon alloy material on the sidewalls and the top surfaces of the inverted U-shaped silicon-carbon alloy structures 40'.

Referring to FIGS. 3A and 3B, end portions of the inverted U-shaped silicon-carbon alloy structures 40' can be optionally truncated. The truncation of the end portions of the inverted U-shaped silicon-carbon alloy structures 40' can be performed, for example, by application of a photoresist layer (not shown) above the top surface of the planarization dielectric layer 50, and lithographic patterning of the photoresist layer to unmask end portions of each inverted U-shaped silicon-carbon alloy structures 40'. The unmasked end portions of the inverted U-shaped silicon-carbon alloy structures 40' can include all regions in which a vertical cross-sectional view along a vertical plane perpendicular to the lengthwise direction of the semiconductor fins 30 does not include any semiconductor fin 30. Subsequently, the unmasked end portions of the inverted U-shaped silicon-carbon alloy structures 40' can be removed by an anisotropic etch that employs the photoresist layer as an etch mask. The photoresist layer can be subsequently removed, for example, by ashing.

A dielectric material is deposited over the inverted U-shaped silicon-carbon alloy structures 40' and the insulator layer 20. The dielectric material can include doped or undoped silicate glass, silicon nitride, or a dielectric oxide of at least one metal such as aluminum oxide. The dielectric material can be deposited by chemical vapor deposition, atomic layer deposition, spin-coating and drying, or other deposition methods known in the art. The dielectric material can be selected among materials that are thermally stable at a temperature at which silicon atoms evaporate from the silicon-carbon alloy material of the inverted U-shaped silicon-carbon alloy structures 40'.

The dielectric material is planarized employing the top surfaces of the inverted U-shaped silicon-carbon alloy structures 40' as stopping surfaces. The planarization of the deposited dielectric material can be performed, for example, by a recess etch, chemical mechanical planarization (CMP), or a combination thereof. The planarized dielectric material constitutes a planarization dielectric layer 50. The planarization dielectric layer 50 can have a top surface that is coplanar with the top surfaces of the inverted U-shaped silicon-carbon alloy structures 40' in a subsequent anneal process. The planarization dielectric layer 50 is a dielectric material layer, i.e., a layer including a dielectric material.

Referring to FIGS. 4A and 4B, horizontal portions of the inverted U-shaped silicon-carbon alloy structures 40' are removed by a recess etch and/or by a planarization process. While an embodiment in which a planarization process is employed is illustrated herein, an embodiment employing a recess etch is also expressly contemplated herein. Each remaining vertical portion of the inverted U-shaped silicon-carbon alloy structures 40' constitutes a silicon-carbon alloy fin 40. Each silicon-carbon alloy fin 40 has a pair of parallel vertical sidewalls adjoined to a top surface and a bottom surface of the silicon-carbon alloy fin 40. In one embodiment, each silicon-carbon alloy fin 40 can have a shape of a rectangular parallelepiped. In one embodiment, removal of the horizontal portions of the inverted U-shaped silicon-carbon alloy structures 40' can be performed by chemical mechanical planarization. In this case, the top surfaces of the silicon-carbon alloy fins 30 can be coplanar with the top surface of the planarization dielectric layer 50 as planarized.

Referring to FIGS. 5A and 5B, the semiconductor fins 30 can be removed selective to the silicon-carbon alloy fins 40 and the planarization dielectric layer 50 by an etch. The etch can be a dry etch or a wet etch. An etch chemistry that removes the semiconductor material of the semiconductor fins 30 selective to the silicon-carbon alloy in the silicon-carbon alloy fins 40 can be employed. In one embodiment, the semiconductor fins 30 can include single crystalline silicon, and the etch chemistry can be a wet etch chemistry that removes silicon selective to a silicon-carbon alloy. A cavity is formed in each volume from which a semiconductor fin 30 is removed.

The cavities can be subsequently filled with a dielectric material. Specifically, the dielectric material can be deposited in the cavity and over the planarization dielectric layer 50 and the silicon-carbon alloy fins 40. The dielectric material can include doped or undoped silicate glass, silicon nitride, or a dielectric oxide of at least one metal such as aluminum oxide. The dielectric material can be deposited by chemical vapor deposition, atomic layer deposition, spin-coating and drying, or other deposition methods known in the art. The dielectric material can be selected among materials that are thermally stable at a temperature at which silicon atoms evaporate from the silicon-carbon alloy material of the silicon-carbon alloy fins 40 in a subsequent anneal process.

The dielectric material is planarized employing the top surfaces of the silicon-carbon alloy fins 40 as stopping surfaces. The planarization of the deposited dielectric material can be performed, for example, by a recess etch, chemical mechanical planarization (CMP), or a combination thereof. Each remaining portion of the planarized dielectric material constitutes a dielectric material portion 60. Each dielectric material portion 60 is a dielectric material portion. The planarization dielectric layer 50 can have a top surface that is coplanar with the top surfaces of the dielectric material portions 60. In one embodiment, each dielectric material portion 60 can be a dielectric material fin. In one embodiment, the dielectric material portions 60 can have a shaped of rectangular parallelepiped. The dielectric material of the dielectric material portions 60 can be different from, or can be the same as, the dielectric material of the planarization layer 50.

Referring to FIGS. 6A-6C, a patterned mask layer 57 is formed across the silicon-carbon alloy fins 40. The patterned mask layer 57 can be a patterned photoresist layer, and can be formed by applying a blanket (unpatterned) photoresist layer over the planarization dielectric layer 50, and by lithographically patterning the applied photoresist layer. The patterned mask layer 57 can straddle middle portions of the silicon-carbon alloy fins 40 such that two end portions of each silicon-carbon alloy fin 40 are not covered by the patterned mask layer 57.

Portions of the planarization dielectric layer 50 and the dielectric material portions 60 that are not covered by the patterned mask layer 57 are recessed selective to the silicon-carbon alloy fins 40. The recessing of the unmasked portions of the planarization dielectric layer 50 and the dielectric material portions 60 can be performed by a recess etch, which can be an anisotropic etch or by an isotropic etch. In one embodiment, the recessing of the unmasked portions of the planarization dielectric layer 50 and the dielectric material portions 60 can be performed by a reactive ion etch, which is an anisotropic etch. The patterned mask layer 57 can be employed as an etch mask during the recessing of the unmasked portions of the planarization dielectric layer 50 and the dielectric material portions 60.

In one embodiment, the unmasked portions of the planarization dielectric layer 50 and the dielectric material portions 60 can be recessed such that recessed surfaces of the unmasked portions of the planarization dielectric layer 50 and the dielectric material portions 60 are formed above a horizontal plane including the top surface of the insulator layer 20. In this case, the top surface of the insulator layer 20 is not physically exposed. In another embodiment, the unmasked portions of the planarization dielectric layer 50 and the dielectric material portions 60 can be completely removed within the areas in which the patterned mask layer 57 is not present. In this case, the top surface of the insulator layer 20 is physically exposed. In yet another embodiment, the unmasked portions of the planarization dielectric layer 50 and the dielectric material portions 60 can be completely removed within the areas in which the patterned mask layer 57 is not present and top surfaces of the insulator layer 20 may be vertically recessed.

Figure 7C:
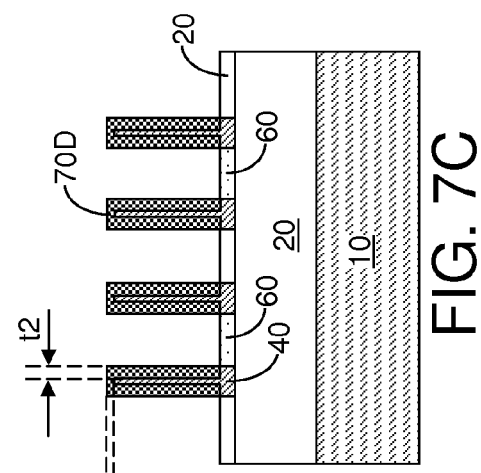
FIG. 7C is a vertical cross-sectional view of the first exemplary structure along the vertical plane C-C' of FIG. 7A.
Figure 7B:
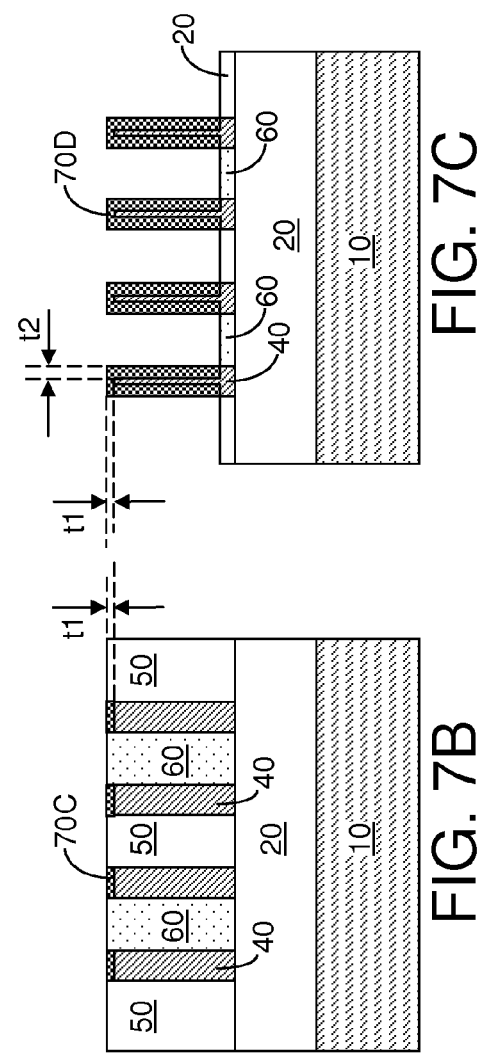
FIG. 7B is a vertical cross-sectional view of the first exemplary structure along the vertical plane B-B' of FIG. 7A.

Referring to FIGS. 7A-7C, the first exemplary structure is placed in a vacuum environment, and is annealed at an elevated temperature at which silicon atoms on the physically surfaces of the silicon-carbon alloy fins 40 evaporate. The evaporation of silicon atoms from the surfaces of the silicon-carbon alloy fins 40 converts surface portions of the silicon-carbon alloy fins 40 into carbon-containing portions in which atomic concentration of carbon exceeds 99%. The carbon atoms in the carbon-containing portions spontaneously agglomerate with short range order to cause formation of graphene layers (70C, 70S, 70D).

Thus, for each silicon-carbon alloy fin 40, a set of at least one contiguous physically exposed surface portion of the silicon-carbon alloy fin 40 is converted into a graphene layer (70C, 70S, 70D) by the anneal process. Specifically, the graphene layer (70C, 70S, 70D) is formed by evaporation of silicon atoms from the set of at least one contiguous physically exposed surface portion of the silicon-carbon alloy fin 40 during the anneal process. Each graphene layer (70C, 70S, 70D) is formed from physically exposed surface portions of the silicon-carbon alloy fins 40. Each graphene layer (70C, 70S, 70D) is formed as a contiguous layer that extends over all surfaces of a silicon-carbon alloy fin 40 that do not physically contact the insulator layer 20, the remaining portions of the planarization dielectric layer 50, or the remaining portions of the dielectric material portions 60.

The anneal process that forms the graphene layer (70C, 70S, 70D) can be performed in a vacuum environment at an elevated temperature, which can be in a range between 1,050° C. and 1,450° C., although lesser and greater anneal temperatures may also be employed. In one embodiment, the anneal process can be performed in a temperature range between 1,150° C. and 1,400° C. In another embodiment, the anneal process that forms the graphene layer (70C, 70S, 70D) can be performed in a an environment containing an inert gas (e.g. Ar) or an active gas (e.g. Si source gases such as dichlorosilane or silane) at a pressure selected from an ultrahigh vacuum (UHV) pressure in a range of about $1 \times 10^{-10}$ Torr to an atmospheric pressure (1 atm. or 760 Torr) and at a temperature which can be in a range between 1,200° C. and 1,600° C., although lesser and greater anneal temperatures may also be employed. Use of an inert gas and/or an active gas can have the positive effect of controlling the growth rate of the graphene layer, and can result in a higher quality graphene layer. An active gas may allow free carbon atoms additional time to diffuse into the most energetically favorable bond states and thus, may form a graphene layer with fewer defects and/or missing atoms by slowing the evaporation rate of the silicon atoms from the silicon carbon alloy.

Each graphene layer (70C, 70S, 70D) includes a horizontal portion contacting the top surface of the underlying silicon-carbon alloy fin 40 and lengthwise vertical portions contacting lengthwise sidewall surfaces of the silicon-carbon alloy fin 40. As used herein, a lengthwise vertical portion of an element is a vertical portion that extends along the lengthwise direction of the element more than along the widthwise direction of the element. As used herein, a lengthwise sidewall surface of an element is a sidewall surface that extends along the lengthwise direction of the element more than the widthwise direction of the element. The lengthwise vertical portions of each graphene layer (70C, 70S, 70D) extend along the lengthwise direction of the underlying silicon-carbon alloy fin 40.

Each graphene layer (70C, 70S, 70D) includes a channel graphene portion 70C, a source graphene portion 70S, and a drain graphene portion 70D. As used herein, a "channel graphene portion" refers to a portion of a graphene layer employed as a channel region of a field effect transistor. As used herein, a "source graphene portion" refers to a portion of a graphene layer employed as a source region of a field effect transistor. As used herein, a "drain graphene portion" refers to a portion of a graphene layer employed as a drain region of a field effect transistor. The channel graphene portion 70C consists of a horizontal portion having a uniform width throughout. Each of the source graphene portion 70S, and the drain graphene portion 70D includes a pair of lengthwise vertical portions and a widthwise vertical portion. As used herein, a widthwise vertical portion is a vertical portion that extends along the widthwise direction of the element more than the lengthwise direction of the element.

In general, the first exemplary structure can include at least a silicon-carbon alloy fin 40 located on an insulator layer 20, a graphene layer (70C, 70S, 70D) located on a top surface of the silicon-carbon alloy fin 40, and a dielectric material layer, i.e., the planarization dielectric layer 50, contacting the silicon-carbon alloy fin 40. A horizontal interface between the graphene layer (70C, 70S, 70D) and the silicon-carbon alloy fin 40 is recessed relative to the top surface of the dielectric material layer.

In one embodiment, the entirety of the top surface of the silicon-carbon alloy fin 40 can be in contact with the graphene layer (70C, 70S, 70D). In one embodiment, the graphene layer (70C, 70S, 70D) includes a vertical portion that contacts a lengthwise sidewall surface of the silicon-carbon alloy fin 40. In one embodiment, a dielectric material portion 60 contacts another lengthwise sidewall surface of the silicon-carbon alloy fin that is laterally offset from the lengthwise sidewall surface by the width of a channel graphene portion 70C, which is herein referred to as the first width w1.

In one embodiment, the silicon-carbon alloy fin 40 can have the first width w1 at a portion including the lengthwise sidewall surface that contacts the planarization dielectric layer 50 or the dielectric material portion 60, and can have a second width w2 that is less than the first width w1 at another portion contacting a lengthwise vertical portion of the graphene layer (70C, 70S, 70D). The difference between the first width w1 and the second width w2 can be twice the thickness of the lengthwise vertical portion of the graphene layer (70C, 70S, 70D). In one embodiment, the graphene layer (70S, 70S, 70D) can include widthwise vertical portions that laterally extend along the widthwise direction of the silicon-carbon alloy fin 40.

In one embodiment, the surface orientations of the semiconductor fins 30 (See FIGS. 1A and 1B) can be selected such that the silicon-carbon alloy fins 40 are formed with a crystallographic orientation that provides lengthwise sidewalls conducive to formation of graphene and a top surface that is less conducive to formation of graphene. For example, the lengthwise sidewalls of the semiconductor fins 30 can have a (111) surface orientation of a diamond cubic crystal structure, and the top surfaces of the semiconductor fins can have a surface orientation that does not have a three-fold symmetry. In this case, the single crystalline silicon-carbon alloy material in the silicon-carbon alloy fins 40 can have a (111) surface orientation on the lengthwise sidewalls and an orientation that does not have a three-fold symmetry on the top surfaces. In this case, the vertical portion of each graphene layer (70C, 70S, 70D) on the lengthwise sidewalls of the silicon-carbon alloy fins 40 can have a greater thickness (which is herein referred to as a second thickness t2) than a horizontal portion of the graphene layer overlying a top surface of the silicon-carbon alloy fin 40. The thickness of the horizontal portion of each graphene layer (70C, 70S, 70D) is herein referred to as a first thickness t1. In one embodiment, the first thickness t1 can correspond to two or three graphene monolayers (i.e., two or three atomic sheets of carbon such that each sheet is a single layer of graphene), and the second thickness t2 can correspond to three to ten graphene monolayers. In this case, each lengthwise vertical portion of a graphene layer (70C, 70S, 70D) has a greater thickness than the horizontal portion of the graphene layer (70C, 70S, 70D).

Each vertical interface between a lengthwise vertical portion of a graphene layer (70C, 70S, 70D) and an underlying silicon-carbon fin 40 is laterally recessed relative to an interface between the silicon-carbon alloy fin 40 and the planarization dielectric layer 50 or relative to an interface between the silicon-carbon alloy fin and a dielectric material portion 60 by at least the second thickness t2.

Referring to FIGS. 8A-8C, a patterned mask layer 77 is formed over the channel graphene portions 70C, unrecessed sub-portions of the dielectric material portions 60, and unrecessed portions of the planarization dielectric layer 50. As used herein, a sub-portion refers to a subset of a portion. In one embodiment, the patterned mask layer 77 can be a patterned photoresist layer. In another embodiment, the patterned mask layer 77 can be a hard mask layer including a dielectric material such as silicon oxide, silicon nitride, and/or a dielectric metal oxide. In this case, the hard mask layer can be deposited as a contiguous material layer and subsequently patterned by a combination of lithographic methods and an etch. At least a portion of each source graphene portions 70S and at least a portion of each drain graphene portions 70D are not masked by the patterned mask layer 77.

Referring to FIGS. 9A-9C, a conductive material can be deposited on the first exemplary structure while the patterned mask layer 77 is present. The conductive material is deposited directly on the surfaces of the source graphene portions 70S and the drain graphene portions 70D. The conductive material can be a metallic material or a doped semiconductor material. The conductive material can be deposited by vacuum evaporation, chemical vapor deposition, physical vapor deposition, or other methods for depositing a conductive material as known in the art. A source contact structure 78S is formed directly on the surfaces of the source graphene portions 70S. A drain contact structure 78D is formed directly on the surfaces of the drain graphene portions 70D.

Referring to FIGS. 10A-10C, the patterned mask layer 77 and any overlying conductive material can be removed. In one embodiment, a combination of an etch process that removes the patterned mask layer 77 and a lift-off process can be employed to remove the patterned mask layer 77 and the overlying conductive material. Optionally, a planarization process can be employed to remove a portion of the deposited conductive material from above the patterned mask layer 77, if present. A gate cavity is formed in a volume from which the patterned mask layer 77 is removed.

A dielectric spacer 86 is deposited on the sidewalls of the source contact structure 78S and the drain contact structure 78D in a peripheral region of the gate cavity. The dielectric spacer 86 can be formed, for example, by deposition of a conformal dielectric material layer and an anisotropic etch that removes horizontal portions of the conformal dielectric material layer. Subsequently, a gate dielectric 80 and a gate electrode 82 can be formed by deposition of a dielectric material and a conductive material, respectively, within the remaining volume of the gate cavity. The stack of the gate dielectric 80 and the gate electrode 82 collectively constitutes a gate structure (80, 82). The gate structure (80, 82) straddles the silicon-carbon alloy fin 40, the planarization dielectric layer 50, and the channel graphene portions 70C of the graphene layer (70C, 70S, 70D). The gate structure (80, 82) contacts top surfaces of the planarization dielectric layer 50, the graphene layer (70C, 70S, 70D), and the dielectric material portions 60.

Referring to FIGS. 11A-11C, a first variation of the first exemplary structure can be derived from the first exemplary structure by recessing the unmasked portions of the planarization dielectric layer 50 and the dielectric material portions 60 until the top surface of the buried insulator layer 20 is physically exposed at the processing steps of FIGS. 6A-6C.

Referring to FIGS. 12A-12C, a second variation of the first exemplary structure can be derived from the first exemplary structure by recessing the unmasked portions of the planarization dielectric layer 50 and the dielectric material portions 60 until the top surface of the buried insulator layer 20, and then recessing physically exposed portions of the top surface of the buried insulator layer 20 at the processing steps of FIGS. 6A-6C. The recessed portions of the top surface of the buried insulator layer 20 are formed below a horizontal plane including interfaces between the buried insulator layer 20 and the silicon-carbon alloy fins 40.

Figure 13A:
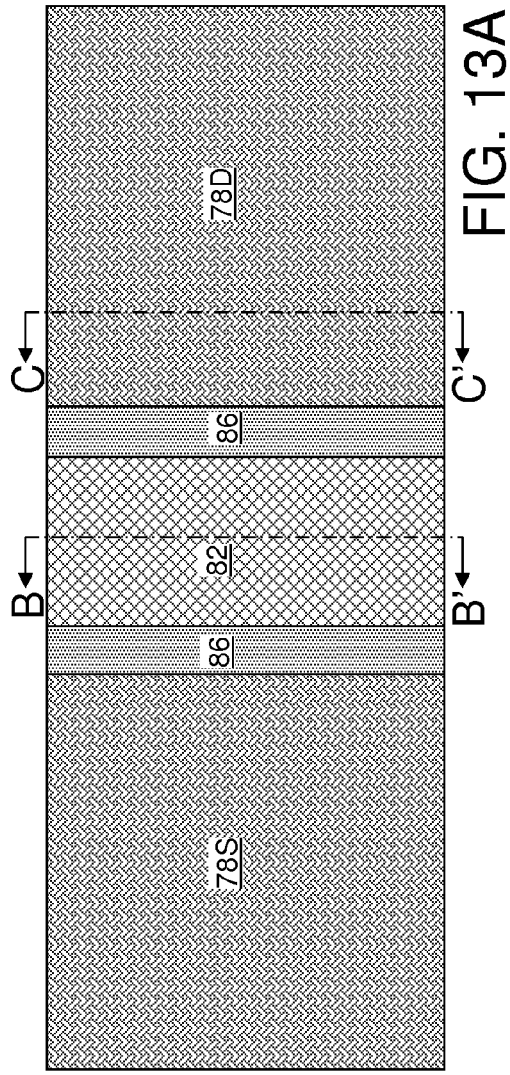
FIG. 13A is a top-down view of a third variation of the first exemplary structure according to an embodiment of the present disclosure.
Figure 13C:
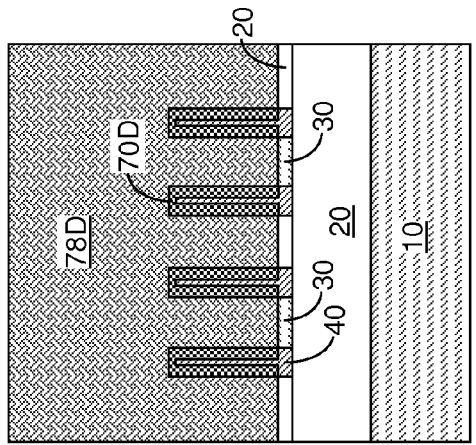
FIG. 13C is a vertical cross-sectional view of the third variation of the first exemplary structure along the vertical plane C-C' of FIG. 13A.
Figure 13B:
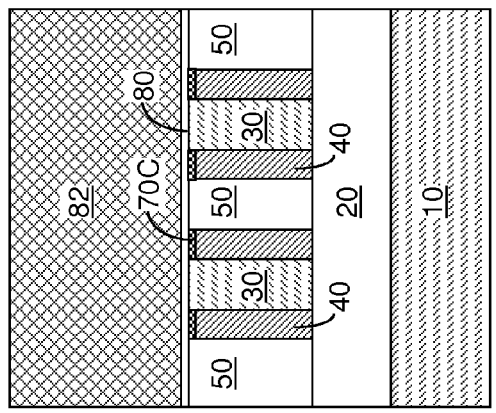
FIG. 13B is a vertical cross-sectional view of the third variation of the first exemplary structure along the vertical plane B-B' of FIG. 13A.

Referring to FIGS. 13A-13C, a third variation of the first exemplary structure can be derived from the first exemplary structure by omitting the processing steps of FIGS. 5A and 5B. In this case, the semiconductor fins 30 are present in lieu of the dielectric material portions 60 during the processing steps of FIGS. 6A-6C and subsequent processing steps. In other words, the semiconductor fins 30 are present on the silicon-carbon alloy fins 40 during the anneal process and thereafter. Surface portions of the semiconductor fins 30 may be evaporated during the anneal process that forms the graphene layers (70C, 70S, 70D) at the processing steps of FIGS. 7A-7C.

Each semiconductor fin 30 is a semiconductor material portion in epitaxial alignment with two silicon-carbon alloy fins 40. Each semiconductor fin 30 can be in contact with a lengthwise sidewall surface of a silicon-carbon alloy fin 40 and a vertical surface of the planarization dielectric layer 50, which is a dielectric material layer.

Referring to FIGS. 14A-14C, a second exemplary structure according to an embodiment of the present disclosure can be derived from the first exemplary structure by omitting the processing steps of FIGS. 6A-6C. Thus, at the processing steps of FIGS. 7A-7C, the anneal process for formation of graphene layers (70C, 70S, 70D) is performed while only horizontal top surfaces of the silicon-carbon alloy fins 40 are physically exposed and all sidewall surfaces of the silicon-carbon alloy fins 40 are not physically exposed.

In this case, the entirety of each graphene layer (70C, 70S, 70D) is located on, and above, the top surface of a silicon-carbon alloy fin 40, and has a same width throughout. The width of each graphene layer (70C, 70S, 70D) is herein referred to as a first width w1. The thickness of each graphene layer (70C, 70S, 70D) is herein referred to as a first thickness t1.

During the processing steps of FIGS. 7A-7C, a contiguous physically exposed surface portion of each silicon-carbon alloy fin 40 is converted into a graphene layer (70C, 70S, 70D) by an anneal process. The anneal conditions can be the same as in the first embodiment. In this case, each contiguous physically exposed surface portion can consist of a surface portion underlying the top surface of the silicon-carbon alloy fin 40. Each graphene layer (70C, 70S, 70D) consists of a horizontal portion contacting the top surface of the underlying silicon-carbon alloy fin 40.

Each graphene layer (70C, 70S, 70D) includes a channel graphene portion 70C, a source graphene portion 70S, and a drain graphene portion 70D. The channel graphene portion 70C consists of a horizontal sub-portion having a uniform width throughout. Each of the source graphene portion 70S and the drain graphene portion 70D consists of a horizontal sub-portion of the graphene layer (70C, 70S, 70C).

In general, the second exemplary structure can include at least a silicon-carbon alloy fin 40 located on an insulator layer 20, a graphene layer (70C, 70S, 70D) located on a top surface of the silicon-carbon alloy fin 40, and a dielectric material layer, i.e., the planarization dielectric layer 50, contacting the silicon-carbon alloy fin 40. A horizontal interface between the graphene layer (70C, 70S, 70D) and the silicon-carbon alloy fin 40 is recessed relative to the top surface of the dielectric material layer.

The processing steps corresponding to FIGS. 8A-8C and subsequent processing steps can be performed to provide the second exemplary structure illustrated in FIGS. 15A-15C.

Referring to FIGS. 16A-16C, a variation of the second exemplary structure can be derived from the second exemplary structure by omitting the processing steps of FIGS. 5A and 5B in addition to omitting the processing steps of FIGS. 6A-6C. In this case, the semiconductor fins 30 are present in lieu of the dielectric material portions 60 during the anneal process corresponding to the processing steps of FIGS. 7A-7C of the first embodiment and during the subsequent processing steps. In other words, the semiconductor fins 30 are present on the silicon-carbon alloy fins 40 during the anneal process and thereafter. Surface portions of the semiconductor fins 30 may be evaporated during the anneal process that forms the graphene layers (70C, 70S, 70D) at the anneal process.

Each semiconductor fin 30 is a semiconductor material portion in epitaxial alignment with two silicon-carbon alloy fins 40. Each semiconductor fin 30 can be in contact with a lengthwise sidewall surface of a silicon-carbon alloy fin 40 and a vertical surface of the planarization dielectric layer 50, which is a dielectric material layer.

While the present disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the present disclosure is intended to encompass all such alternatives, modifications and variations which fall within the scope and spirit of the present disclosure and the following claims.

What is claimed is:

1. A method of forming a structure comprising:
    forming a silicon-carbon alloy fin located on an insulator layer;
    forming a graphene layer located on a top surface of said silicon-carbon alloy fin;
    forming a planarization dielectric material layer contacting said silicon-carbon alloy fin, wherein a horizontal interface between said graphene layer and said silicon-carbon alloy fin is recessed relative to a top surface of said planarization dielectric material layer; and
    forming a gate structure comprising a stack of a gate dielectric and a gate electrode and straddling said silicon-carbon alloy fin and contacting said to surface of said planarization dielectric material layer.

2. The method of claim 1, further comprising forming a gate structure comprising a stack of a gate dielectric and a gate electrode across said silicon-carbon alloy fin and over said planarization dielectric layer and said graphene layer.

3. The method of claim 1, further comprising recessing portions of said planarization dielectric layer selective to said silicon-carbon alloy fin prior to formation of said graphene layer.

4. The method of claim 3, further comprising:
    forming a patterned mask layer over said silicon-carbon alloy fin; and
    recessing said planarization dielectric layer selective to said silicon-carbon alloy fin employing said patterned mask layer as an etch mask.

5. The method of claim 3, wherein said graphene layer comprises a horizontal portion contacting a top surface of said silicon-carbon alloy fin and lengthwise vertical portions contacting lengthwise sidewall surfaces of said silicon-carbon alloy fin.

6. The method of claim 5, wherein each lengthwise vertical portion of said graphene layer has a greater thickness than a horizontal portion of said graphene layer.

7. The method of claim 1, wherein said graphene layer is formed by evaporation of silicon atoms from said set of at least one contiguous physically exposed surface portion of said silicon-carbon alloy fin during said anneal process.

8. The method of claim 1, further comprising replacing said semiconductor fin with a dielectric material portion prior to performing said anneal process.

9. The method of claim 1, wherein said semiconductor fin is present on said silicon-carbon alloy fin during said anneal process.

10. The method of claim 1, wherein said set of at least one contiguous physically exposed surface portion consists of a surface portion underlying a top surface of said silicon-carbon alloy fin.

11. A semiconductor structure comprising:
    a silicon-carbon alloy fin located on an insulator layer;
    a graphene layer located on a top surface of said silicon-carbon alloy fin;
    a dielectric material layer contacting said silicon-carbon alloy fin, wherein a horizontal interface between said graphene layer and said silicon-carbon alloy fin is recessed relative to a top surface of said dielectric material layer; and
    a gate structure comprising a stack of a gate dielectric and a gate electrode and straddling said silicon-carbon alloy fin and contacting said top surface of said dielectric material layer.

12. The semiconductor structure of claim 11, wherein an entirety of said top surface of said silicon-carbon alloy fin is in contact with said graphene layer.

13. The semiconductor structure of claim 11, wherein said graphene layer includes a vertical portion that contacts a lengthwise sidewall surface of said silicon-carbon alloy fin.

14. The semiconductor structure of claim 13, further comprising a dielectric material fin contacting another lengthwise sidewall surface of said silicon-carbon alloy fin that is laterally offset from said lengthwise sidewall surface.

15. The semiconductor structure of claim 14, wherein said silicon-carbon alloy fin has a first width at a portion including said lengthwise sidewall surface, and has a second width that is less than said first width at another portion.

16. The semiconductor structure of claim 14, wherein said graphene layer includes widthwise vertical portions that laterally extend along a widthwise direction of said silicon-carbon alloy fin.

17. The semiconductor structure of claim 13, wherein said vertical portion of said graphene layer has a greater thickness than a horizontal portion of said graphene layer overlying a top surface of said silicon-carbon alloy fin.

18. The semiconductor structure of claim 11, wherein an entirety of said graphene layer is located on, and above, said top surface of said silicon-carbon alloy fin and has a same width throughout.

19. The semiconductor structure of claim 11, further comprising a dielectric material portion in contact with a lengthwise sidewall surface of said silicon-carbon alloy fin and a vertical surface of said dielectric material layer.

20. The semiconductor structure of claim 11, further comprising a semiconductor material portion in epitaxial alignment with said silicon-carbon alloy fin and in contact with a lengthwise sidewall surface of said silicon-carbon alloy fin and a vertical surface of said dielectric material layer.

* * * * *